(12) United States Patent
Tetelbaum et al.

(10) Patent No.: US 8,922,176 B2
(45) Date of Patent: Dec. 30, 2014

(54) PROGRAMMABLE SLEW RATE POWER SWITCH

(75) Inventors: Alexander Tetelbaum, Beer Sheva (IL); Tomer Shaul Elran, Petah Tikva (IL)

(73) Assignee: SanDisk Technologies Inc., Plano, TX (US)

( * ) Notice: Subject to any disclaimer, the term of this patent is extended or adjusted under 35 U.S.C. 154(b) by 335 days.

(21) Appl. No.: 13/409,828

(22) Filed: Mar. 1, 2012

(65) Prior Publication Data
US 2013/0229166 A1    Sep. 5, 2013

(51) Int. Cl.
*G05F 1/59*    (2006.01)
(52) U.S. Cl.
USPC .............................. 323/269; 323/274; 323/281
(58) Field of Classification Search
USPC .................................. 323/269, 273, 274, 281
See application file for complete search history.

(56) References Cited

U.S. PATENT DOCUMENTS

| | | | |
|---|---|---|---|
| 4,746,813 A | 5/1988 | Disser | |
| 7,764,054 B1 | 7/2010 | Guo et al. | |
| 7,852,053 B2 | 12/2010 | Martin et al. | |
| 7,863,875 B1 | 1/2011 | Guo et al. | |
| 7,940,101 B2 | 5/2011 | Rai et al. | |
| 8,035,363 B2 | 10/2011 | Joos et al. | |
| 2006/0267665 A1 | 11/2006 | Kawamoto | |
| 2011/0316502 A1* | 12/2011 | Tang et al. | 323/271 |
| 2013/0229166 A1* | 9/2013 | Tetelbaum et al. | 323/312 |
| 2014/0055110 A1* | 2/2014 | Richter et al. | 323/281 |

FOREIGN PATENT DOCUMENTS

WO    2013/130480    9/2013

OTHER PUBLICATIONS

PCT International Search Report and Written Opinion dated May 14, 2013 issued in PCT/US2013/027818.

* cited by examiner

*Primary Examiner* — Jeffrey Sterrett
(74) *Attorney, Agent, or Firm* — Brinks Gilson & Lione

(57) ABSTRACT

An apparatus is configured to provide a voltage rising at the output with a programmable slew rate. The apparatus comprises a ramp-up control circuit module for supplying an increasing output voltage that is output to a load circuit. The ramp-up control circuit comprises an amplifier that receives the output of a plurality of selectable mirrored current sources that build up voltage across a capacitor for programming a selected linear slew rate for the increasing output voltage. The apparatus further comprises a glitch filter circuit for stabilizing the increasing output voltage so as to minimize glitches, including current and voltage stress, in the output voltage.

21 Claims, 5 Drawing Sheets

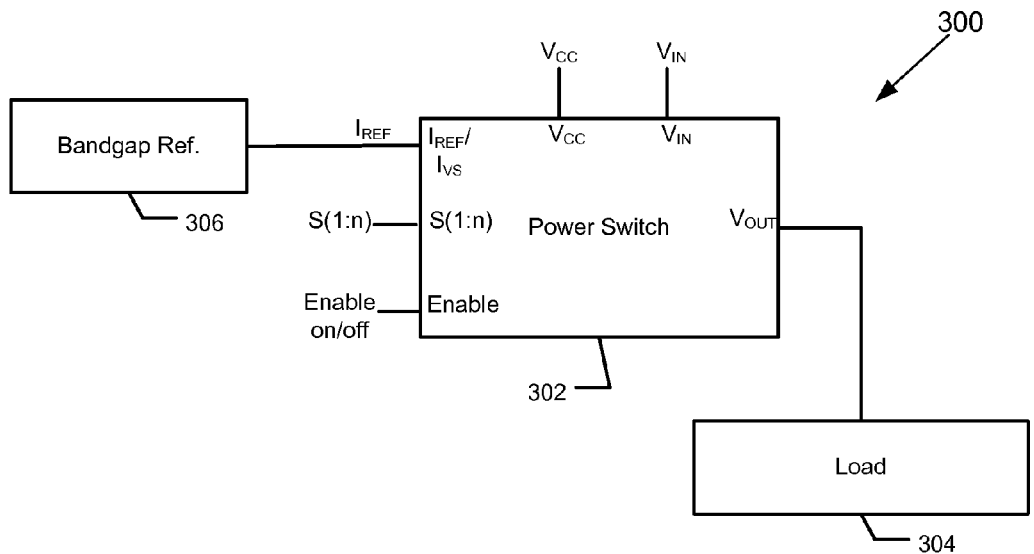
Figure 3
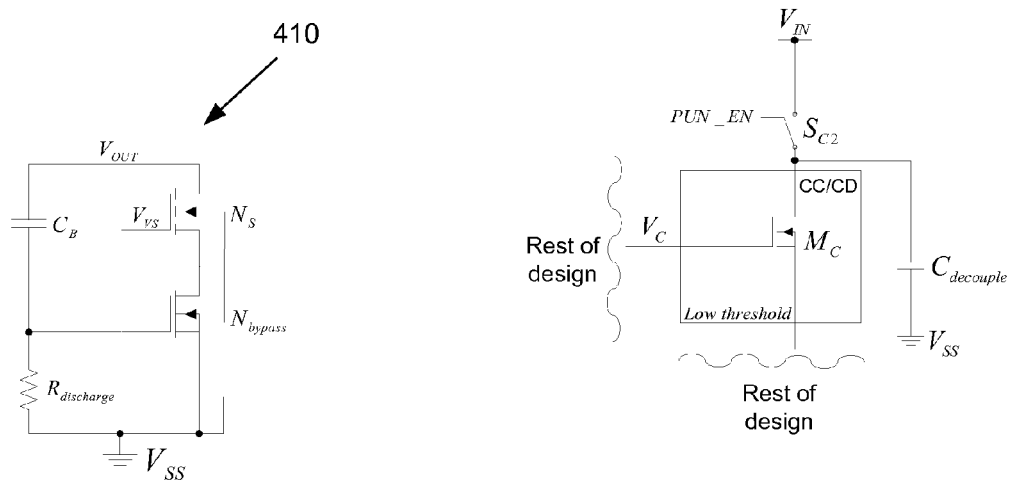
Figure 5
Figure 7

US 8,922,176 B2

PROGRAMMABLE SLEW RATE POWER SWITCH

BACKGROUND OF THE INVENTION

This invention relates generally to electrical circuits, and more particularly to apparatus and methods for providing an increasing power supply voltage.

Several different types of electronic devices can utilize an increasing voltage supply. One such example is a one-time programmable electric fuse, which is a type of non-volatile memory. An electric fuse can be used to provide memory for chip ID, configuration settings, feature selection, etc.

One type of voltage supply switch for providing an increasing voltage supply is based on a digital approach. FIG. 1 is a diagrammatic representation of a digital voltage supply switch 150. In general, a circuit that implements this approach includes an oscillator (CLK), counter 122, decoder 124, and resistive network 112 for normal operation.

According to a required ramp-up slew rate, a time period is determined by a counter 122 and a decoder 124. In every such period, the proper switch 112, e.g., selected from switches RN0-RNn, is closed and an appropriate gate voltage, e.g., VG0-VGn, is imposed on a corresponding power transistor. Module 106 contains a system of power transistors P0-Pn. In summary, each of the power transistors corresponds to a different switch (RN0-RNn) path. An output voltage VDD_OUT is then supplied to load 104.

The output voltage VDD_OUT profile for this circuit has a staircase shape as illustrated in the graph 200 of FIG. 2. The lowest voltage stair is obtained when all the power transistors are switched off. Every pulse that is provided by the decoder (124) turns on a successive power transistor, which each yield a new voltage stair, e.g., BUF0-BUFn. Eventually, the voltage output staircase wave, VDD_OUT, reaches its target peak voltage, VDD_IN-IR drop. Although this digital approach achieves a particular voltage output slew rate, such implementation is very sensitive to the process parameters, temperature, output load 104 and resistive network 112, as well as requiring a clock (CLK).

Improved voltage switch devices for providing an increasing output voltage rise with a programmable slew rate would be beneficial.

SUMMARY OF THE INVENTION

In general, apparatus and techniques for supplying an accurate ramping up of power supply voltage with programmed slew rates are provided. In one embodiment, an apparatus is configured to provide a voltage output with a programmable slew rate. The apparatus comprises a Ramp-Up Control circuit module for supplying an increasing output voltage that is output to a load circuit. The Ramp-Up Control circuit comprises an amplifier that receives the output of a plurality of selectable mirrored current sources for programming a selected linear slew rate for the increasing output voltage. The apparatus further comprises a glitch filter circuit for stabilizing the increasing output voltage so as to minimize glitches, including current and voltage stress, in the output voltage.

In a specific implementation, the amplifier has a low threshold voltage and is a three port device having a first port coupled to a supply voltage, a second port for receiving a voltage and a third port for substantially copying the voltage from the second port, and the ramp-up control circuit further comprises a capacitor $C_C$ that is coupled to the first port, wherein selection of one or more of the selectable mirrored current mirrors and a capacitance value for the capacitor $C_C$ results in the selected linear slew rate. In a further aspect, the amplifier is a CD (common drain) voltage follower transistor in the form of an n-channel metal oxide semiconductor field effect transistor (NMOSFET) or a CC (common collector) transistor in the form of a BJT (bipolar junction transistor), and the capacitor $C_C$ and the one or more of the selectable current sources are coupled with the NMOSFET's gate or the BJT's base to cause an increasing input voltage having the selected linear slew rate, which increases from zero to a maximum voltage corresponding to the supply voltage.

In another embodiment, the selected linear slew rate is equal to a sum of one or more current values from the one or more selected mirrored current sources divided by the capacitance value of the capacitor $C_C$, and any of the above described devices can be used with this slew selection technique. In yet another feature, the apparatus further comprises a voltage sensor circuit for sensing that the output voltage has reached a predefined threshold value, enabling and disabling of the glitch filter circuit, and finalizing ramp up of such output voltage according to the selected linear slew rate. In a further aspect, the apparatus further comprises a power switch transistor that is arranged to be turned on by the voltage sensor circuit and provide an additional load current as the output voltage approaches a predefined threshold value. This voltage sensor may be implemented with any combination of the above specified voltage followers, three-port devices, power switch transistor, and linear slew rate selection features. The power switch transistor may be implemented with any combination of the above specified voltage followers, three-port devices, voltage sensor, and linear slew rate selection features.

In yet a further embodiment, the voltage sensor further comprises a first transistor for receiving the output voltage and turning off when the output voltage reaches the maximum value (e.g., when the output voltage reaches some upper-threshold value set by the size of this transistor and the current force by the mirror at the drain of this transistor, such as 75% of the final nominal voltage value, and after the signal propagates to the power transistor and slowing draws it from cut-off region); a Schmitt trigger for receiving a decreasing input voltage as the first transistor turns off and outputting an inversion of the input voltage when it reaches the Schmitt trigger's lower threshold; a second transistor for receiving the inversion of the input voltage and, in response, turning off. The power transistor has an input coupled to an output of the second transistor to receive the inversion, a sensor network of mirrored current sources and a capacitor $C_{VS}$ that charges and decreases a sensor voltage in correlation with a current of the sensor network to thereby turn on the power transistor at the selected slew rate, ramping up to the additional load current (e.g., so that now the voltage ramp up is finalized by this power transistor and an output voltage at its maximum value that is equal to $V_{IN}$ minus the IR drop of all the power switch is achieved). This specific voltage sensor embodiment may be implemented with any combination of the above specified voltage followers, three-port devices, power switch transistor, voltage sensor features, and linear slew rate selection features. In another aspect, the glitch filter circuit comprises a first transistor coupled to an RC circuit that is coupled to the increasing output voltage and is configured to filter high frequencies, which are ≥

$$\frac{1}{2\pi R_{discharge} C_B}$$

and a second transistor for receiving the sensed voltage caused by high frequencies that are being filtered and for conducting all other frequencies until the "glitch" is over. The glitch filter can remain active until the sensor voltage causes the power transistor $M_P$ to turn on and the output voltage has ramped up to its maximum level. The glitch filter can be operable to prevent undesirable phenomenon that affects the proper linear rise of the output voltage from the ramp-up control switch. This specific glitch filter embodiment may be implemented with any combination of the above specified voltage followers, three-port devices, and power switch transistor, voltage sensor features, and linear slew rate selection features.

In an alternative embodiment, the ramp-up control circuit may further comprise a decoupling capacitor $C_{decouple}$ coupled to the amplifier for reducing any high frequency rises in the increasing output voltage. In another embodiment, the apparatus further includes a pull down network for discharging the output voltage after the ramp-control circuit is disabled and a break-before-make circuit for enabling the ramp-up control circuit while disabling the pull-down circuit and for disabling the ramp-up control circuit while then enabling the pull down network to discharge the output voltage. This decoupling capacitor, and/or pull down network and break-before-make circuit embodiments may be implemented with any combination of the above specified voltage followers, three-port devices, and power switch transistor, voltage sensor features, and linear slew rate selection features.

In another embodiment, an apparatus comprises a voltage follower device receiving an increasing gate voltage from a plurality of selectable mirrored current sources and a capacitor so as that the increasing gate voltage has a linear slew rate that is defined by a current value sum for the selectable mirrored current sources divided by a capacitance value of the capacitor, wherein the voltage follower transistor is configured to output an increasing output voltage that follows the increasing gate voltage. This apparatus also comprises a Glitch Filter circuit coupled to the increasing output voltage to filter sharp rises in the increasing output voltage caused by parasitic capacitance between terminals of the voltage follower transistor or instantaneous current demands of the load. The apparatus also includes a Voltage Sensor circuit for outputting a slowly decreasing Voltage Sensor output and a power transistor for receiving the slowly decreasing Voltage Sensor and slowly turning on so as to finalize ramping up of the increasing voltage at the linear slew rate to provide a full drive current. This specific apparatus embodiment may be implemented with any combination of the above specified voltage followers, three-port devices, power switch transistor, voltage sensor, glitch filter, decoupling capacitor, pull-down network, break-before-make circuit features, and linear slew rate selection features.

In other embodiments, the invention pertains to a method of operating any one or more of the above described apparatus component combinations. In one embodiment, a particular linear slew rate for supplying an increasing output voltage that is output from a ramp-up control circuit to a load circuit is determined. One or more of a plurality of selectable mirrored current sources of the ramp-up control circuit are selected so as to program the particular linear slew rate, which is based on the one or more selected mirrored current sources and a capacitance value of a capacitor $C_C$ of the ramp-up control circuit.

In a specific implementation, the increasing output voltage is stabilized with a glitch filter circuit so as to minimize glitches in the increasing output voltage if caused by rapid switching of the one or more selected current sources. The particular linear slew rate is equal to a sum of one or more current values from the one or more selected mirrored current sources divided by the capacitance value of the capacitor $C_C$ of the ramp-up control circuit. In a further aspect, a sensor circuit is used to sense that the output voltage has reached a predefined threshold value, and enabling the glitch filter circuit, and finalizing ramp up of such output voltage according to the particular linear slew rate These and other features of the present invention will be presented in more detail in the following specification of embodiments of the invention and the accompanying figures, which illustrate by way of example the principles of the invention.

BRIEF DESCRIPTION OF THE DRAWINGS

FIG. 3 is a diagrammatic representation of a high-level system in which a programmable power switch of the present invention may be implemented.

FIG. 5 is a schematic diagram of a Glitch Filter circuit in accordance with one embodiment of the present invention.

FIG. 7 is a schematic diagram of a decoupling capacitor $C_{decouple}$ attached to the drain of transistor $M_C$.

DETAILED DESCRIPTION OF SPECIFIC EMBODIMENTS

Figure 1:
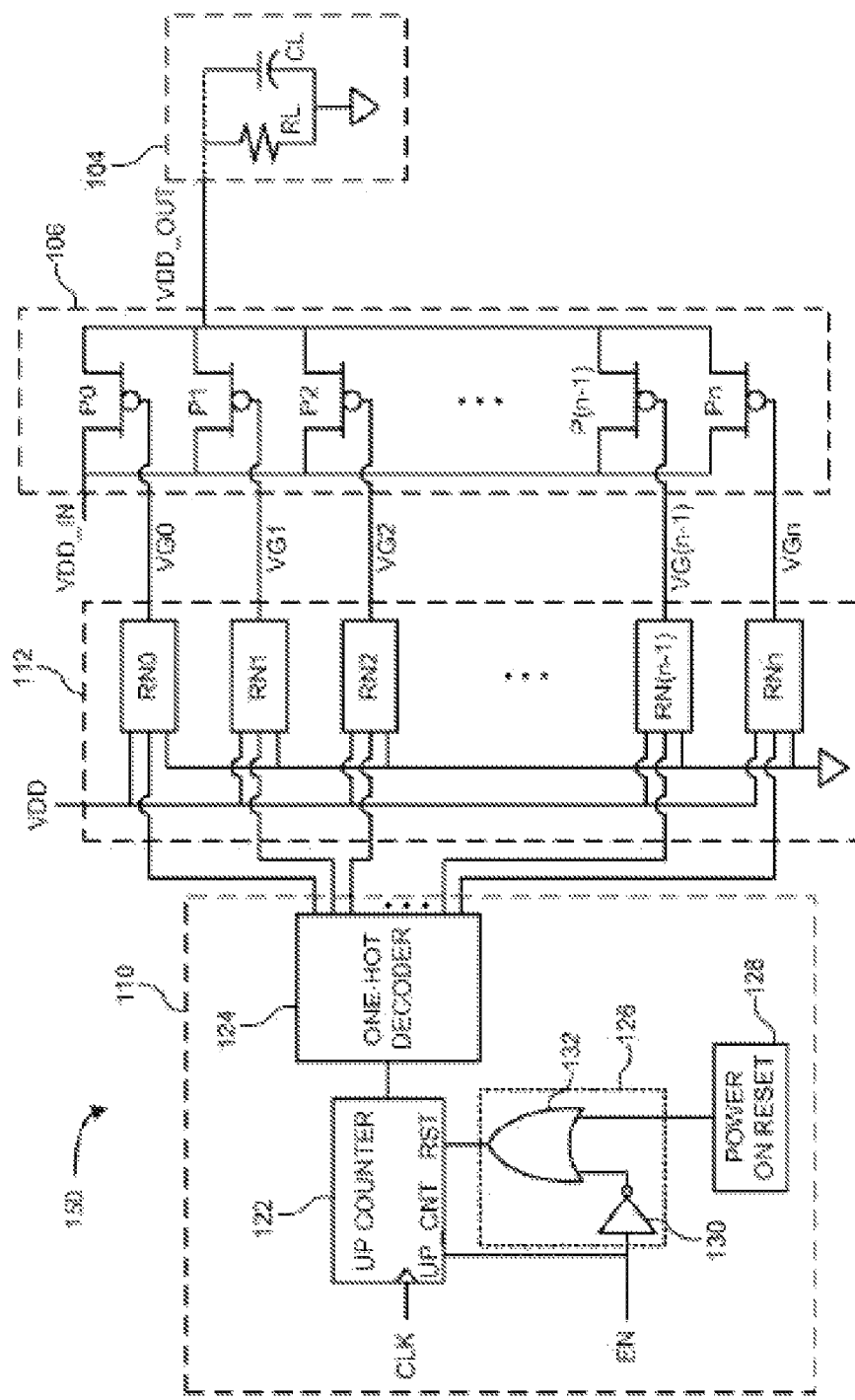
FIG. 1 is a diagrammatic representation of a digital voltage supply switch.
Figure 2:
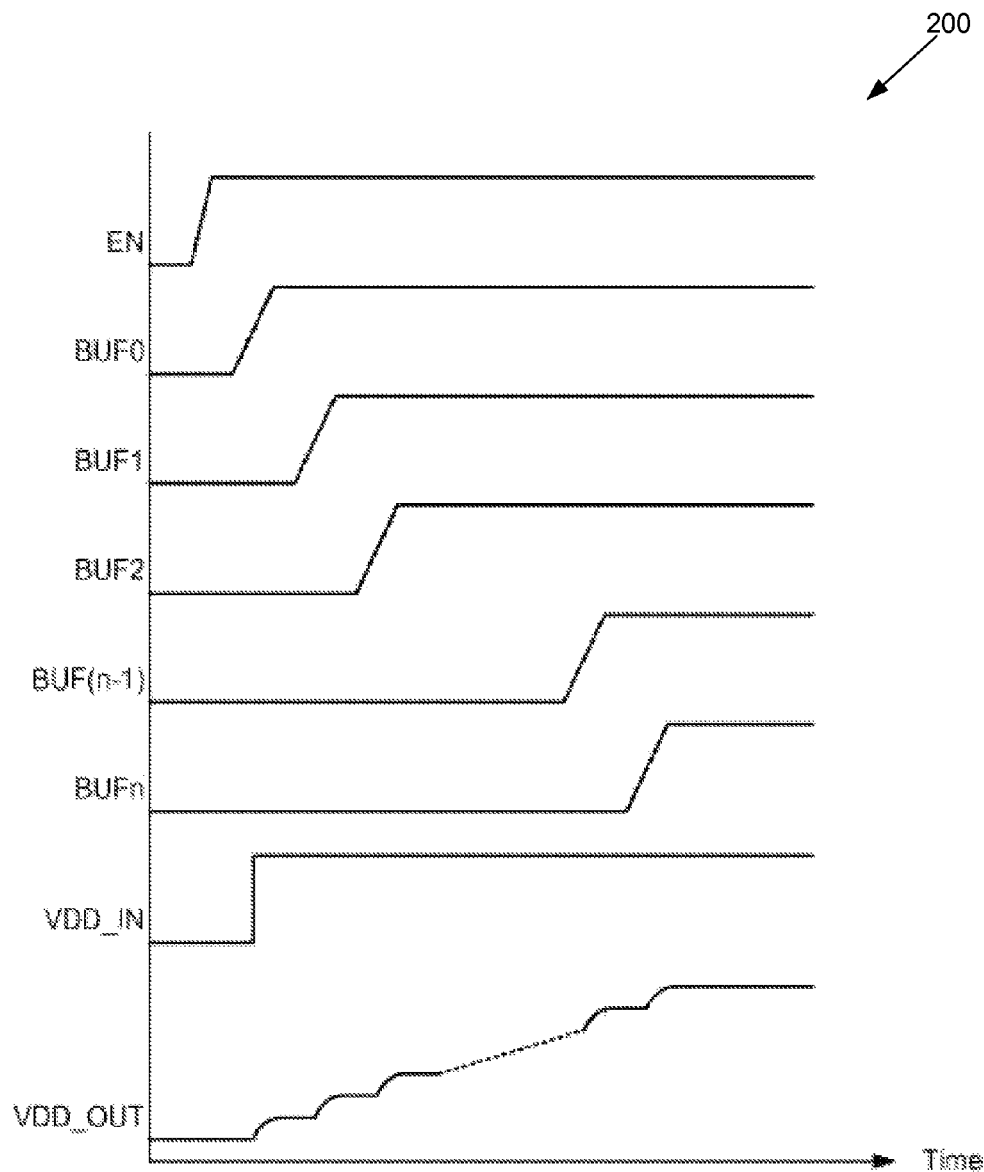
FIG. 2 is a timing diagram for a digital voltage switch.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The following embodiments are directed towards a power switch that is based on an analog approach. In general, a current reference, $I_{REF}$, is selectively mirrored to the gate of one or more suitably sized transistors that form part of an I-C network that yields a linear output voltage as described further below.

Before turning to the details of programmable power switch embodiments of the present invention, exemplary system architectures will first be described. FIG. 3 is a diagrammatic representation of a high-level system 300 in which a programmable power switch of the present invention may be implemented. As shown, a bandgap current reference 306 can be used to provide one or more current sources, such as a current reference, $I_{REF}$, to a programmable power switch 302. In general, a bandgap reference (voltage or current) may be used to provide a current reference to switch 302, and the switch can be configured to implement current mirrors that mirror any desired current, based on such reference current, for use inside the switch. Any suitable current source device may be utilized and ideally such device provides a consistent current source with a low sensitivity to power supply and temperature changes. Although a bandgap current reference is illustrated, one or more alternative devices (e.g., transistor current and LED current sources, transistor and diode current sources, op-amp current sources, voltage regulator current sources, etc.) may be used to provide one or more reference currents to the power switch 302.

The programmable power switch 302 can be arranged to receive one or more current sources, $I_{REF}$, from bandgap current reference 306 and also receive input voltages $V_{CC}$ and $V_{IN}$ from any suitable power source (not shown). The power switch is configured to supply a linearly increasing voltage $V_{OUT}$ to a load circuit 304. The load circuit can take the form of any electronic circuitry that is arranged to receive a voltage supply having a linear slew rate. By way of example, the load circuit 304 may be in the form of a one-time programmable electric fuse (eFuse) that forms part of a high density array of eFuses (e.g., 32-bit by 8 one-time programmable eFuses).

Figure 4:
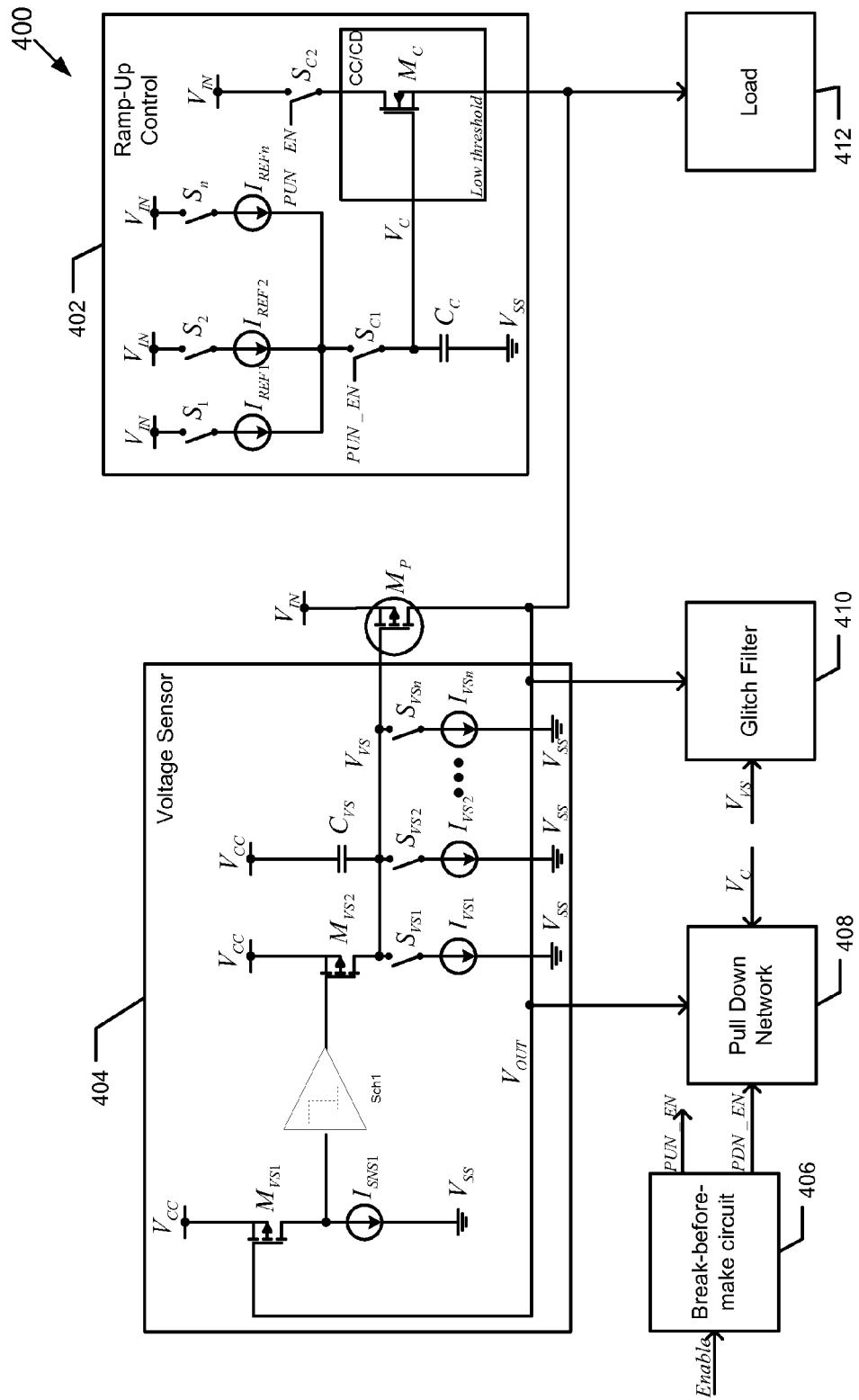
FIG. 4 is a schematic diagram of a programmable power switch in accordance with a specific implementation of the present invention.

FIG. 4 is a schematic diagram of a programmable power switch 400 in accordance with a specific implementation of the present invention. As shown, the programmable power switch 400 may include a Ramp-Up Control circuit 402 for controlling the slew rate of an output voltage $V_{OUT}$ supplied to load circuit 412, a Glitch Filter 410 for minimizing glitches in the output voltage $V_{OUT}$, a Voltage Sensor 404 for sensing that the output voltage $V_{OUT}$ has reached a predefined threshold value (e.g., 75% of nominal final voltage) and finalizing the ramp up of such output voltage according to the programmed slew rate by turning on $M_P$ transistor, and one or more enable and discharge circuits (e.g., break-before make circuit 406 and Pull Down Network 408).

In general, the Ramp-Up Control circuit 402 may include a plurality of selectable current mirrors, $I_{REF1}$-$I_{REFn}$. Each of the current mirrors, $I_{REF1}$-$I_{REFn}$, is connected to an input voltage $V_{IN}$. One or more of the current mirror sources are selectable by closing one or more switches $S_1$-$S_n$. When an enable signal (PUN_EN) is applied (logic 1) to switch $S_{C1}$, a summation of the selected current sources begins to flow and the voltage on the gate of $M_C$ increases.

In one embodiment, before applying the enable signal PUN_EN to the Ramp-Up Control circuit 402, the Break-Before-Make circuit 406 can be configured to settle the signal PDN_EN to a logical "low" value in order to disable Pull Down Network 408 and prevent short circuits. To turn off the switch, the Break-Before-Make circuit can be configured to first disable the PUN_EN (settling logic "low"). Only after PUN_EN is disabled, the Break-Before-Make circuit 406 may then enable PDN_EN also to prevent a short circuit from $V_{IN}$ to $V_{SS}$. The role of Break-Before-Make is to close PDN_EN before enabling PUN_EN for enabling the process and to close PUN_EN before enabling PDN_EN for disabling the process. That is, there is a delay between the transitions of the PDN_EN and the PUN_EN signals.

Without the Break-Before-Make circuit 406, short circuit may take place between $V_{IN}$ and $V_{SS}$. During operation, the Pull-Up-Network (PUN) is enabled (e.g., Ramp-Up-Control and the $M_p$ transistor are enabled) while Pull-Down-Network (PDN) is disabled. Next the switch is turned off by turning off the Enable signal. If there is no Break-Before-Make circuit 406, the PDN is enabled now (to discharge the output) and the PUN is disabled (so as to not consume current from $V_{IN}$). The process of changing between an enable and disable mode takes time. For example, after 10 ns have passed, the signals may be in an intermediate halfway state between their initial value and their final value. As such, the PUN is not fully closed now and the PDN is not fully opened (they are "half-enabled"). In effect, the transistors of PUN and PDN operate and conduct current from the source $V_{IN}$ to the ground $V_{SS}$. As a result, a short circuit current may occur from $V_{IN}$ to $V_{SS}$ for about a 10 ns-20 ns of duration of the signal, which would immediately burn the device. The description of turn-on case is similar. To protect the device, signals PUN_EN and PDN_EN are selected to be distant in time for the time it takes to signal to propagate and fully close the PUN (in case of disable) or PDN (in case of enable).

$M_C$ may take the form of any suitable amplifier, such as the illustrated low threshold transistor or a low threshold operational amplifier or native transistor. In certain embodiments, $M_C$ is a three-port device with a first port coupled to a power supply, a second port for receiving a voltage, and a third port for substantially copying ("following") the voltage from the second port (and enabling high current capability at the third port). $M_C$ may be a common drain (CD), in case of MOSFET, or common collector (CC) voltage follower transistor, in case of Bipolar Junction Transistor (BJT). In certain embodiments, the transistor $M_C$ has a threshold voltage $V_t$ that is negative (depletion mode) or substantially close to 0 (native mode). The drain of the illustrated transistor $M_C$ is also coupled to $V_{IN}$ when enabled by enable signal (e.g., PUN_EN on switch $S_{c2}$), and the source of $M_C$ is coupled to the output voltage $V_{OUT}$, which follows the increasing gate voltage $V_C$ since the threshold voltage is kept low.

Although an n-channel MOSFET (metal oxide semiconductor field-effect transistor) depletion or native mode type transistor $M_C$ is used in the illustrated example, one would appreciate that other types of transistors could be readily implemented. For example, any other type of insulated gate FET, besides a MOSFET, transistor can be used. By way of another example, a common collector npn type BJT voltage follower can be used for $M_C$. Additionally, the transistor may be enhancement mode, for which different relative $V_C$ and $V_{IN}$ may be chosen to account for a positive threshold voltage. A plurality of transistors may also be used in place of $M_C$, and such transistors can be controlled by a plurality of selectable current sources to thereby yield an output voltage $V_{OUT}$ that is an accumulation of the individual output voltages of the multiple transistors.

In the illustrated embodiment, the gate of $M_C$ is also connected to a capacitor, $C_C$, which along with selection of the current mirrors ($I_{REF1}$-$I_{REFn}$) forms an I-C network that yields linear voltage growth at a particular slew rate on the gate of $M_C$ via switches $S_1$-$S_n$, as described further below. Since the voltage amplification of the common drain topology is substantially equal to 1, the output voltage on the source ($V_{OUT}$) follows the gate voltage $V_C$ with a corresponding change of $I_{DS}$ current according to the connected load. Thus, a particular slew rate of $V_{OUT}$ can be programmed by the selection of one or more current mirrors and a particular capacitance value of the capacitor $C_C$.

In one embodiment, the slew rate determination and programming is based on a very simple I-C analysis. Once $I_{REF}$ is instated, a slew rate (SR) can be determined by:

$$\dot{V}_C = \frac{I_{REF}}{C_C}$$

Time integration over both sides will yield:

$$V_C - V_{C0} = \int_{0}^{T} \frac{I_{REF}}{C_C} dt$$

One can assume $V_{C0}=0$ since during proper operation, either when enabled or disabled, this branch is fully charged or discharged. With $V_{C0}=0$, the following equation results:

$$V_C(t=T) = \int_{0}^{T} \frac{I_{REF}}{C_C} dt$$

Although, the capacitor $C_C$ may be dependent on voltage applied across it, this effect is negligible. Since $I_{REF}$ and $C_C$ can be considered independent of time, the following equation can be derived:

$$V_C(t=T) = \frac{I_{REF}T}{C_C}$$

While the upper boundary for $V_C$ is $V_{IN}$, the transistor inside the switch $S_{C1}$ of Ramp-Up Control 402 enters into the linear region, then $V_{DS}$ across it approaches "0", and therefore, $$V_{IN} = \frac{I_{REF}T}{C_C}$$

Finally, the slew rate can be expressed as:

$$\boxed{SR = \frac{V_{IN}}{T} = \frac{I_{REF}}{C_C} = \frac{I_{REF1} + \ldots + I_{REFn}}{C_C}}$$

Since a high current is to be conducted through $M_C$ in order to compensate current consumable by the load 412, $M_C$ will tend to be large. When the switch is implemented on silicon, a 1 mA current can be a really high current. A transistor that is capable of handling such a large current or higher, as well as compensating Glitch Filter demands and load demands with current will be large. Each MOSFET transistor has W (width) and L (length). When the ratio W/L>>1, for example, this transistor may be considered to have a large size. However, the actual size of the transistor would be determined based on a simulation using the particular physics of the particular fabrication process. The transistor size would also depend on the noise on $V_{CC}$. If voltage $V_{CC}$ is noisy, high harmonies may penetrate through a very small parasitic capacitor of the transistor and, thus, even the small transistor in terms of W/L ratio may be large enough.

When $M_C$ is designed to have a large size, there can cause coupling between the $M_C$ terminals. That is, there is a parasitic capacitor between the source and drain of $M_C$. When the switch PUN_EN is closed, there is an instantaneous rise up or glitch in the voltage on output voltage $V_{OUT}$. To alleviate this disturbance, $V_{OUT}$ can be connected to a Glitch Filter circuit 410, which is configured to minimize disturbances. In general, the Glitch Filter circuit 410 minimizes disturbances from the output voltage $V_{OUT}$ rising too fast or not as expected. This filter can also be useful for any other type of glitch that might happen during the process of $V_{OUT}$ rising (instantaneous current demand of load, non-linear load etc.).

The Glitch Filter 410 can take the form of a closed loop RC circuit that helps control the output voltage ramp. FIG. 5 is a schematic diagram of a Glitch Filter circuit 410 in accordance with one embodiment of the present invention. As shown, the Glitch Filter circuit 410 includes a first transistor $N_S$ (NMOS enhancement mode) having a gate voltage of $V_{VS}$, which is supplied from Voltage Sensor circuit 404, while the source is coupled to $V_{OUT}$. A second transistor $N_{bypass}$ (NMOS, native or depletion mode) is coupled to the drain of the first transistor $N_S$. A capacitor $C_B$ is coupled between the source of the first transistor $N_S$ ($V_{OUT}$) and the gate of the second transistor $N_{bypass}$. A resistor $R_{discharge}$ is coupled between the capacitor $C_B$ (and gate of $N_{bypass}$) and ground.

In the illustrated example, the Glitch Filter circuit 410 is generally configured to turn on when the output voltage $V_{OUT}$ begins to rise. Specifically, the Glitch Filter circuit 410 is controlled by a $V_{VS}$ signal from Voltage Sensor 404. In one embodiment, $V_{VS}$ is high until power transistor $M_P$ leaves the cut-off region. At first when $V_{VS}$ is high, transistor $N_S$ conducts.

Capacitor $C_B$ and $R_{discharge}$ form a high pass filter (HPF) with knee frequency of:

$$\frac{1}{2\pi R_{discharge} C_B}.$$

All the frequencies higher than this knee frequency are shortened and form voltage at the gate of native transistor $N_{bypass}$. Consequently, this transistor $N_{bypass}$ is also opened (it means, that GF "feels the glitch") and conducts other frequencies, which the $C_B R_{discharge}$ filter was unable to filter. When the glitch is filtered from $V_{OUT}$, $N_{bypass}$ closes, and $V_{OUT}$ continues to build up. The filter may also be useful during $V_{OUT}$ rise.

When the output voltage $V_{OUT}$ goes up fast (e.g., faster than the RC time constant of the Glitch Filter circuit), the capacitor $C_B$ discharges and the gate voltage of transistor $N_{bypass}$ increases so that transistor $N_{bypass}$ turns on and conducts current. The result is a voltage drop on $V_{OUT}$ when $V_{OUT}$ increases too quickly. If the output voltage goes up slowly (e.g., slower than the RC time constant), in contrast, capacitor $C_B$ charges and the gate of $N_{bypass}$ is not increased. As a result of no increase in gate voltage (e.g., relative to the source voltage), transistor $N_{bypass}$ remains off and does not affect $V_{OUT}$. In this embodiment, the Voltage Sensor 404 is also configured to cause the Glitch Filter circuit to turn off in response to the Voltage Sensor's output voltage ($V_{VS}$) becoming stable (e.g., decreasing towards turning $M_P$ on). As the output $V_{VS}$ of the sensor circuit 404 slowly decreases and is applied to the gate of transistor $N_S$, $N_S$ is slowly turned off (in accordance to slow turning of $M_P$ on, as $M_P$ is the power transistor capable to drive the full current possibility of the switch. Therefore, the Glitch Filter 410 does not undergo high current stress when there is a "glitch"). At this stage the $N_S$ transistor's gate voltage falls and its current capability decreases once $V_{GS}$ drops below the threshold of $N_S$ and the Glitch Filter circuit no longer provides a filtering as the rise-up has finished.

As $V_{OUT}$ approaches $V_{IN}$, transistor $M_C$ enters the linear region and its $V_{DS}$ approaches 0. As a result, the Ramp-Up Control circuit 402 can provide only limited maximal current to load circuit 412. To provide more load current, Voltage Sensor 404 is operable to react to the output voltage $V_{OUT}$ as it approaches $V_{IN}$ (e.g., 75% of $V_{IN}$) and use such output voltage $V_{OUT}$ to provide more drive to the load circuit 412 by turning on a large power transistor $M_P$ to conduct onto the $V_{OUT}$ node.

In a specific implementation, the voltage output $V_{OUT}$ from the Ramp-Up Control circuit 402 is supplied to the gate of a first transistor $M_{VS1}$ (PMOS, enhancement mode) in the Voltage Sensor circuit 404. The source of this first transistor is also coupled to supply voltage $V_{CC}$, and the drain is coupled to current source (or mirror) $I_{SNS1}$. Transistors $M_{VS1}$ and $M_{VS2}$ are "on" when $V_{OUT}$ is low. As the output voltage $V_{OUT}$ from the Ramp-Up Control circuit 402 approaches a predefined threshold (e.g., 3 V) and results in an increase in $V_{GS}$ for $M_{VS1}$, the transistor $M_{VS1}$ reaches cut-off. Consequently, the input voltage to the Schmitt Trigger (Sch1) also decreases from $V_{CC}$ as $M_{VS1}$ reaches cutoff. That is, $M_{VS1}$ can no longer hold enough current to hold the input of Sch1 high. Once the bottom threshold of Sch1 is reached, Sch1 outputs an inversion of its input, which is output to the gate of $M_{VS2}$ to thereby cause $M_{VS2}$ (PMOS) to also be put into the cut-off region.

Appropriately tuned current mirrors $I_{VS1}$-$I_{VSn}$ are correlated to the same slew rate generated by the mirrored current sources $I_{REF}$ and cause capacitor $C_{VS}$ to slowly charge so as to result in a controlled $V_{VS}$. As $V_{VS}$ slowly drops, power transistor $M_P$ (PMOS enhancement mode) slowly opens according to the selected slew rate, finalizing the ramp up of the output voltage $V_{OUT}$ to drive its full-specification) load current.

In an alternative embodiment, a large decoupling capacitor $C_{decouple}$ is attached to the drain of $M_C$ and the Glitch Filter is not used. FIG. 7 is a schematic diagram of a decoupling capacitor $C_{decouple}$ attached to the drain of transistor $M_C$. The other components of the programmable switch of FIG. 4 may also be present, except for the Glitch Filter circuit.

Figure 6:
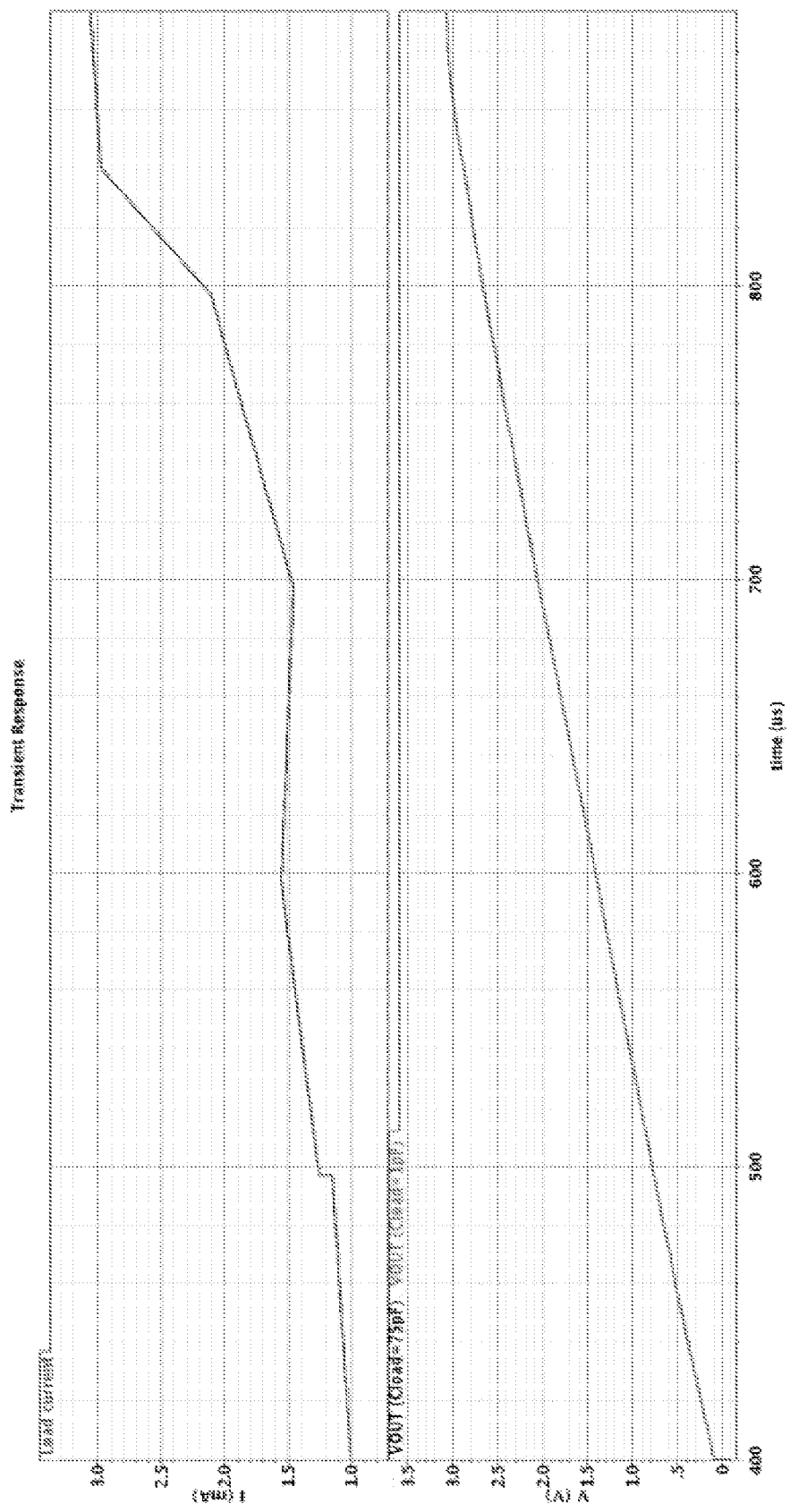
FIG. 6 is a graph of the linear output voltage's ramping profile from a programmable power switch in accordance with one embodiment of the present invention.

Certain embodiments of an analog programmable voltage supply circuit provide a smooth linear voltage ramping profile (unlike discrete ramp-up of by digital circuit) as shown in FIG. 6. As shown, the output voltage $V_{OUT}$ remains linear for different capacitive load values, 75 pF and 1 pF, as well as a load current that changes non-linearly from 1 mA to 3.1 mA. In this graph, the slew rate was adjusted to be 6.25 mV/1 µs. The bottom graph of FIG. 6 shows two converging linear profiles for the output voltage, even when there are two very different capacitance values. That is, a linear rise for the output voltage is achieved without being affected by non-linear varying loads and capacitance.

In order to avoid high short circuit current conductance, a Break-Before-Make circuit 406 may be employed. Once the enable flag (PUN_EN enable signal) for the power switch is removed, the power circuitry is caused to be turned off. After the power enable flag is removed, the Pull Down Network (PDN) 408 is activated (via PDN_EN enable signal) to discharge the output, $V_{OUT}$, and the CC/CD input, $V_C$. So in the case of the state "switch disabled" (Enable=0), the PDN_EN is the delayed inversion of PUN_EN. In the case of the state "switch enabled" (Enable=1), the PUN_EN is the delayed inversion of PDN_EN.

The programming of this new power switch circuit allows choosing a total $I_{REF}$ current, yielding the demanded SR. This new technique described here allows highly effective control of the SR along with "clean" (low glitches) output and linear (analog) ramp-up. During ramp up, the ability of a power switch to provide current to the load is limited by maximal current ability of the Ramp-Up Control circuit 402. In cases in which more current needs to be provided to the load before reaching nominal output voltage, the inversion threshold of the Sch1 might be corrected to cause $M_p$ to turn on sooner. Additionally, current mirror $I_{SNS1}$ may be tuned so as to increase current sinking and allow $M_P$ to turn on earlier.

The power transistor $M_P$ can continue providing current to the load circuit 412 and such power transistor's slew rate can be the same as of the Ramp-Up Control circuit 402 because the final stage of the Voltage Sensor 404 can be designed by the same principle using an I-C network of mirrored currents $I_{VS}$ and capacitor $C_{VS}$.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. An apparatus for providing an output voltage with a programmable slew rate, comprising:
   a ramp-up control circuit module for supplying an increasing output voltage that is output to a load circuit, wherein the ramp-up control circuit comprises an amplifier receiving the output of a plurality of selectable mirrored current sources for programming a selected linear slew rate for the increasing output voltage; and
   a glitch filter circuit for stabilizing the increasing output voltage so as to minimize glitches, including voltage and current stress, in the output voltage.

2. The apparatus of claim 1, wherein the amplifier has a low threshold voltage and is a three port device having a first port coupled to a supply voltage, a second port for receiving a voltage and a third port for substantially copying the voltage from the second port, and the ramp-up control circuit further comprises a capacitor $C_C$ that is coupled to the first port, wherein selection of one or more of the selectable mirrored current mirrors and a capacitance value for the capacitor $C_C$ results in the selected linear slew rate.

3. The apparatus of claim 2, wherein the amplifier is a CD (common drain) voltage follower transistor in the form of an n-channel metal oxide semiconductor field effect transistor (NMOSFET) or a CC (common collector) transistor in the form of a BJT (bipolar junction transistor), and wherein the capacitor $C_C$ and the one or more of the selectable current sources are coupled with the NMOSFET's gate or the BJT's base to cause an increasing input voltage having the selected linear slew rate, which increases from zero to a maximum voltage that is the supply voltage.

4. The apparatus of claim 2, wherein the selected linear slew rate is equal to a sum of one or more current values from the one or more selected mirrored current sources divided by the capacitance value of the capacitor $C_C$.

5. The apparatus of claim 1, further comprising:
   a voltage sensor circuit for sensing that the output voltage has reached a predefined threshold value, enabling and disabling of the glitch filter circuit, and finalizing ramp up of such output voltage according to the selected linear slew rate.

6. The apparatus of claim 5, further comprising a power switch transistor that is arranged to be turned on by the voltage sensor circuit and provide an additional load current as the output voltage approaches a predefined threshold value.

7. The apparatus of claim 6, wherein the voltage sensor further comprises:
    a first transistor for receiving the output voltage and turning off when the output voltage reaches the predefined threshold value;
    a Schmitt trigger for receiving a decreasing input voltage as the first transistor turns off and outputting an inversion of the input voltage when it reaches the Schmitt trigger's lower threshold; and
    a second transistor for receiving the inversion of the input voltage and, in response, turning off, and
    wherein the power transistor has an input coupled to an output of the second transistor to receive the inversion, a sensor network of mirrored current sources and a capacitor $C_{VS}$ that charges and decreases a sensor voltage in correlation with a current of the sensor network to thereby turn on the power transistor at the selected slew rate, ramping up to the additional load current.

8. The apparatus of claim 7, wherein the glitch filter circuit comprises:
    a first transistor coupled to an RC circuit that is coupled to the increasing output voltage and is configured to filter one or more selected high frequencies from the increasing output voltage;
    a second transistor for receiving the sensor voltage and conducting all other frequencies until a glitch is diminished,
    wherein the glitch filter circuit remains active until the sensor voltage causes the power transistor to turn on and the output voltage has ramped up to the predefined threshold value.

9. The apparatus of claim 1, wherein the ramp-up control circuit further comprises a decoupling capacitor $C_{decouple}$ coupled to the amplifier for reducing any high frequency rises in the increasing output voltage.

10. The apparatus of claim 1, further comprising:
    a pull down network for discharging the output voltage after the ramp-control circuit is disabled; and
    a break-before-make circuit for enabling the ramp-up control circuit while disabling the pull-down circuit and for disabling the ramp-up control circuit while then enabling the pull down network to discharge the output voltage.

11. A method of providing a voltage output with a programmable slew rate, comprising:
    determining a particular linear slew rate for supplying an increasing output voltage that is output from a ramp-up control circuit to a load circuit; and
    selecting one or more of a plurality of selectable mirrored current sources of the ramp-up control circuit so as to program the particular linear slew rate, which is based on the one or more selected mirrored current sources and a capacitance value of a capacitor $C_C$ of the ramp-up control circuit.

12. The method of claim 11, further comprising stabilizing the increasing output voltage with a glitch filter circuit so as to minimize glitches in the increasing output voltage if caused by rapid switching of the one or more selected current sources, wherein the particular linear slew rate is equal to a sum of one or more current values from the one or more selected mirrored current sources divided by the capacitance value of the capacitor $C_C$ of the ramp-up control circuit.

13. The method of claim 12, with a sensor circuit sensing that the output voltage has reached a predefined threshold value, and enabling the glitch filter circuit, and finalizing ramp up of such output voltage according to the particular linear slew rate.

14. An apparatus for providing an output voltage with a programmable slew rate, comprising:
    a voltage follower device receiving an increasing gate voltage from a plurality of selectable mirrored current sources and a capacitor $C_C$ so as that the increasing gate voltage has a linear slew rate that is defined by a current value sum for the selectable mirrored current sources divided by a capacitance value of the capacitor $C_C$, wherein the voltage follower transistor is configured to output an increasing output voltage that follows the increasing gate voltage;
    a glitch filter circuit coupled to the increasing output voltage to filter sharp rises in the increasing output voltage caused by parasitic capacitance between terminals of the voltage follower transistor or instantaneous current demands of the load;
    a voltage sensor circuit for outputting a slowly decreasing voltage sensor output; and
    a power transistor for receiving the slowly decreasing voltage sensor and slowly turning on so as to finalize ramping up of the increasing voltage at the linear slew rate to provide a full drive current.

15. The apparatus of claim 14, wherein the voltage sensor circuit is further arranged to sense that the output voltage has reached a predefined threshold value, enable and disable the glitch filter circuit, and finalize ramp up of such output voltage according to the selected linear slew rate.

16. The apparatus of claim 15, wherein the power switch transistor is arranged to be turned on by the voltage sensor circuit and provide the full drive current as the output voltage approaches a predefined threshold value.

17. The apparatus of claim 16, wherein the voltage sensor further comprises:
    a first transistor for receiving the output voltage and turning off when the output voltage reaches the predefined threshold value;
    a Schmitt trigger for receiving a decreasing input voltage as the first transistor turns off and outputting an inversion of the input voltage when it reaches the Schmitt trigger's lower threshold; and
    a second transistor for receiving the inversion of the input voltage and, in response, turning off, and
    wherein the power transistor has an input coupled to an output of the second transistor to receive the inversion, a sensor network of mirrored current sources and a capacitor $C_{VS}$ that charges and decreases a sensor voltage in correlation with a current of the sensor network to thereby turn on the power transistor at the selected slew rate, ramping up to the additional load current.

18. The apparatus of claim 17, wherein the glitch filter circuit comprises:
    a first transistor coupled to an RC circuit that is coupled to the increasing output voltage and is configured to filter one or more selected high frequencies from the increasing output voltage;
    a second transistor for receiving the sensor voltage and conducting all other frequencies until a glitch is diminished,
    wherein the glitch filter circuit remains active until the sensor voltage causes the power transistor to turn on and the output voltage has ramped up to its maximum level.

19. The apparatus of claim 14, wherein the voltage follower device in the form of an n-channel metal oxide semiconductor field effect transistor (NMOSFET) a CC (common collector)

transistor in the form of a BJT (bipolar junction transistor), and wherein the capacitor $C_C$ and the one or more of the selectable current sources are coupled with the NMOSFET's gate or the BJT's base to cause an increasing gate voltage having the selected linear slew rate, which increases from zero to a maximum voltage that is also provided as a drain voltage to the NMOSFET or emitter voltage of the BJT, wherein the output voltage is supplied from the source of the NMOSFET or collector of the BJT and substantially follows the increasing gate voltage.

20. The apparatus of claim 19, wherein the ramp-up control circuit further comprises a decoupling capacitor $C_{decouple}$ coupled to the amplifier for reducing any high frequency rises in the increasing output voltage.

21. The apparatus of claim 19, further comprising:
   a pull down network for discharging the output voltage after the ramp-control circuit is disabled; and
   a break-before-make circuit for enabling the ramp-up control circuit while disabling the pull-down circuit and for disabling the ramp-up control circuit while then enabling the pull down network to discharge the output voltage.

* * * * *